United States Patent [19]

Huehne

[11] Patent Number: 5,059,826
[45] Date of Patent: Oct. 22, 1991

[54] VOLTAGE THRESHOLD GENERATOR FOR USE IN DIODE LOAD EMITTER COUPLED LOGIC CIRCUITS

[75] Inventor: Karl J. Huehne, Austin, Tex.

[73] Assignee: Motorola Inc., Schaumburg, Ill.

[21] Appl. No.: 443,790

[22] Filed: Nov. 30, 1989

[51] Int. Cl.[5] .................... H03K 19/12; H03K 17/16
[52] U.S. Cl. .................................. 307/455; 307/456; 307/362; 307/296.1
[58] Field of Search ............ 307/443, 454–456, 307/362, 542, 296.1

[56] References Cited

U.S. PATENT DOCUMENTS 4,612,460 9/1986 Gloaguen et al. ................. 307/455
4,806,796 2/1989 Bushey et al. ..................... 307/455

Primary Examiner—Stanley D. Miller
Assistant Examiner—Margaret Rose Wambach
Attorney, Agent, or Firm—Michael D. Bingham

[57] ABSTRACT

A circuit which provides a threshold voltage to a single-ended operated diode load emitter coupled logic circuit includes a transistor having an emitter coupled to an output at which the threshold voltage is produced, a collector coupled to a positive supply conductor and a diode coupled between the positive supply conductor and the base of the transistor. A current source is coupled to the emitter of the transistor which sinks a current that is equal to the "tail" current of the logic circuit. The magnitude of the threshold voltage produced is equal to a value that lies midway between the logic output voltage swing developed across the diode loads of the logic circuit.

4 Claims, 1 Drawing Sheet

VOLTAGE THRESHOLD GENERATOR FOR USE IN DIODE LOAD EMITTER COUPLED LOGIC CIRCUITS

BACKGROUND OF THE INVENTION

The present invention relates to emitter coupled logic and current mode logic circuits and, more particularly, to diode load emitter coupled logic circuits (DLECL). DLECL circuits are known in the art which use diodes as the load elements of the emitter coupled logic circuit to provide a minimum logic output voltage swing to thereby increase the operation speed of the logic circuit. Most, if not all, DLECL circuits are operated differentially, i.e., the input logic signals are differentially applied to the emitter coupled input stage of the logic circuit. For example, feedback counters are generally constructed with flip-flops connected in series with one or more outputs that are fed back to the first flip-flop of the counter through a DLECL gate. These outputs to the gate are differentially coupled thereto. Another example of a differentially coupled DLECL circuit is a modulus divider described in U.S. Pat. No. 4,585,957.

A common problem with operating DLECL circuits differentially is that this requires series gating, i.e., the stacking of ECL gates to obtain the necessary logic function. Although series gating may conserve current requirement it requires at least an additional diode voltage drop between the power supply which thus limits the minimum supply voltage and also requires the driving output to be level shifted which is usually accomplished using emitter followers which use additional current. A solution or alternative method is to use a single-ended logic input to the DLECL instead of differential applied logic input. This however requires a reference or threshold voltage that is applied to one input of the gate in order to have the gate logically switch output operating states in response to the logic input varying above and below the reference voltage. This reference voltage must ideally be centered between the logic output signal swing.

Hence, a need exists for a threshold voltage generator that can provide the reference voltage required to operate DLECL circuits in a single-ended operation mode.

SUMMARY OF THE INVENTION

It is an object of the present invention to provide an improved DLECL circuit.

It is another object of the present invention to provide an improved single-ended operated DLECL circuit.

Still another object of the present invention is to provide a voltage reference generator for use in a single-ended operated DLECL circuit.

In accordance with the above and other objects there is provided a voltage generator for providing a reference potential at an output which includes a first transistor the emitter of which is coupled to the output and a collector that is coupled to a first power supply conductor, a diode is coupled between the first power supply conductor and the base of the first transistor while a current supply is coupled between the emitter of the first transistor and a second power supply conductor.

It is an aspect of the invention that the voltage generator is utilized in a single-ended DLECL circuit wherein the output of the generator is connected to a first input of the DLECL circuit while the second input thereof receives a single-ended logic input signal. In addition the current supply supplies a current the magnitude of which is substantially equal to the common current supply of the DLECL circuit.

DETAILED DESCRIPTION OF THE PREFERRED EMBODIMENTS

Figure 1:
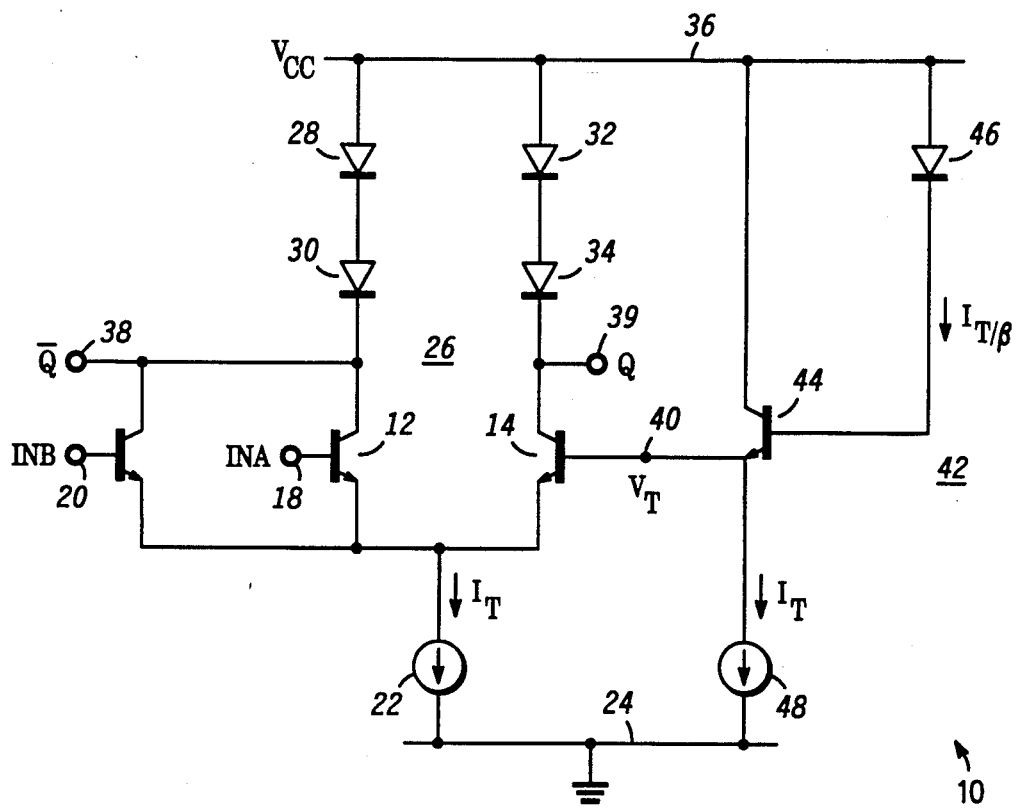
FIG. 1 is a schematic diagram illustrating a single-ended DLECL circuit of the present invention which includes a threshold voltage generator circuit of a preferred embodiment.

Turning to FIG. 1 there is shown single-ended operated DLECL circuit 10 of the present invention including the novel threshold voltage generator circuit 42 of the present invention. By way of example only, DLECL circuit is shown as a simple OR/NOR gate it being understood that other DLECL circuits having other logic functions and operated single-ended can utilize threshold voltage generator 42 in a similar manner to be described herein. The OR/NOR gate includes emitter-coupled transistors 12, 14 and 16 with the bases of transistors 12 and 16 receiving logic input signals supplied thereto at inputs 18 and 20. The interconnected emitters are coupled to current supply 22 which is returned to power supply conductor 24 to which is supplied ground reference potential. Current supply 22 supplies a "tail" current $I_T$ that is switched through either transistor 14 or transistors 12 and/or 16 depending on the logic inputs supplied to the latter two transistors. Diode load circuitry 26, including diodes 28 and 30 series coupled between the collectors of transistors 12 and 16 and power supply conductor 36 as well as diodes 32 and 34 series coupled between the collector of transistor 14 and power supply conductor 36, provides a minimum logic output signal swing at the $\overline{Q}$ output, terminal 38, and at the Q output, terminal 39, of DLECL circuit 10.

In order to operate DLECL circuit 10 in a single-ended mode it is necessary that the base of transistor 14 be supplied a threshold reference potential $V_T$ that is substantially equal to one-half the logic input signal swing applied to inputs INA and INB (inputs 18 and 20). Typically, the logic input signals are supplied from a previous DLECL circuit wherein the logic swing is derived across a pair of diode loads similar to diodes 28 and 30. Moreover, it is understood that the outputs of DLECL circuit 10 will usually be supplied to inputs of a similar logic circuit or to emitter followers. Thus, for example, the $\overline{Q}$ output (terminal 38) will be coupled to a base of transistor that is switched on and off by the logic signal appearing thereat. Therefore, using DLECL circuit 10 as an example, when INA is greater than $V_T$, transistor 12 is turned on and transistor 14 is turned off such that $I_T$ flows through the transistor and diodes 28 and 30 as transistors 12, 14 and 16 are operated in a non-saturating mode as understood. Conversely, as inputs INA and INB are less than $V_T$, transistor 12 tends to be turned off where the current $I_T$ flows through transistor 14 and diodes 32 and 34. In this state, the only current flowing through diodes 28 and 30 is base current required by the emitter follower or next logic circuit coupled to output 38 which, assuming the following circuit is biased by a current $I_T$, will be equal to $I_T/\beta$, where $\beta$ is the forward current gain of the following circuit having a transistor with its base coupled to output 38 and operated in a non-saturating mode. Thus the voltage swing across diode loads 28 and 30 can be determined by comparing the voltage at output 38 as the logic signal thereat is switched between high, $V_H$, and low, $V_L$, output states. Therefore, the logic output states are:

$$V_H = Vcc - 2(kT/q)\ln\left(\frac{I_T}{\beta}/I_s\right); \text{ and} \quad (1)$$

$$V_L = Vcc - 2(kT/q)\ln\left(\frac{I_T}{I_s}\right) \quad (2)$$

where $V_H$ and $V_L$ are derived from the classic diode-voltage equation.

As previously mentioned, the threshold potential $V_T$ should be set to a value that is midway between the single-ended diode load output swing, i.e.:

$$V_T = (V_H + V_L)/2; \text{ or} \quad (3)$$

$$V_T = \left[2Vcc - 2(kT/q)\ln\left(\frac{I_T}{\beta}/I_s\right) - 2(kT/q)\ln\left(\frac{I_T}{I_s}\right)\right]/2. \quad (4)$$

Equation 4 simplifies to:

$$V_T = Vcc - (kT/q)\ln\left(\frac{I_T}{\beta}/I_s\right) - (kT/q)\ln\left(\frac{I_T}{I_s}\right). \quad (5)$$

The present invention now proceeds to realize a voltage threshold generator that will supply the value of $V_T$ stated in equation 5.

Referring back now to FIG. 1 there is illustrated voltage threshold generator 42 for providing the required $V_T$ necessary to permit single-ended operation of DLECL circuit 10. Generator 42 is shown as comprising transistor 44 the emitter of which is coupled to terminal 40 at which the threshold voltage $V_T$ is provided. The collector of transistor 44 is coupled to power supply conductor 36 while diode 46 is connected between the power supply conductor and the base of the transistor. Current supply 48 which sinks a current $I_T$ through transistor 44 is coupled between the emitter thereof and power supply conductor 24.

Since transistor 44 is operated in a non-saturated condition the base current supplied thereto through diode 46 is in the first approximation equal to $I_T/\beta$. Solving now for the value of $V_T$ generated at the emitter of transistor 44 by voltage threshold generator 42 and supplied to terminal 40 gives:

$$V_T = Vcc - (kT/q)\ln\left(\frac{I_T}{\beta}/I_s\right) - (kT/q)\ln\left(\frac{I_T}{I_s}\right). \quad (6)$$

Comparing equation 6 with equation 5 shows that the value of $V_T$ produced at the emitter of transistor 44 and supplied to terminal 40 is equal to the midway value of the logic output voltage swing across the diode loads of DLECL circuit 10.

As already mentioned the output of DLECL circuit 10, for example, terminal 38 may in some circuit configurations such as feedback counters not only be coupled to the base of a transistor of a next DLECL circuit but may also be coupled to another input whereby in the high state two factors of $I_T/\beta$ flow through the diode loads. In this case the second term of equation 5 would be equal to $$(kT/q)\ln\left(2\frac{I_T}{\beta}/I_s\right).$$

Figure 2:
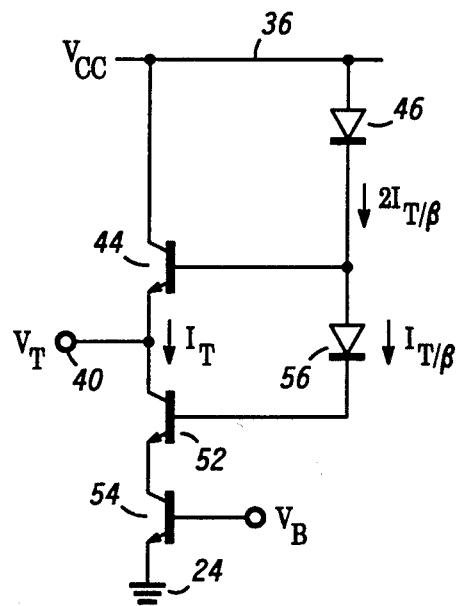
FIG. 2 is a schematic diagram of a of threshold voltage generator of a second embodiment of the present invention.

Turning now to FIG. 2 there is illustrated voltage threshold generator 50 of a second embodiment which provides the reference potential $V_T$ at terminal 40 equal to:

$$V_T = Vcc - (kT/q)\ln\left(2\frac{I_T}{\beta}/I_s\right) - (kT/q)\ln\left(\frac{I_T}{I_s}\right). \quad (7)$$

Hence, if the diode loads of DLECL circuit 10 are required to drive the inputs of two DLECL single-ended circuits, voltage generator circuit 50 provides the required threshold voltage.

Threshold voltage generator circuit 50 is shown as including an additional transistor 52 the collector-emitter conduction path of which is coupled between the emitter of transistor 44 and current supply 48. Current supply 48 as illustrated may be comprised of a transistor 54 that has its base biased to a potential $V_B$ in order to sink the current $I_T$. An additional diode 56 is coupled between the base of transistor 44 and the base of transistor 52 the latter of which is also operated in a non-saturated state. It is understood that all diodes may be realized by an NPN transistor having its base and collector shorted together to form the anode of the diode while the emitter forms the cathode of the diode. Therefore, since transistor 44 and diode 46 can be identical to the diode loads, the magnitude of $V_T$ will track and remain midway between the voltage swing across the diode loads over process variations, temperature and $\beta$ variations.

Hence, what has been described above are novel voltage threshold generators for providing a threshold voltage for biasing a single-ended operated DLECL circuit. The threshold voltage has a magnitude that tracks the non-linear diode loads of the DLECL circuit and is substantially equal to a value that lies midway between the logic signal output swing developed across the diode loads.

What is claimed is:

1. A voltage reference generator for providing an output reference voltage of a predetermined substantially constant value at an output, comprising:

a first transistor having first and second electrodes and a control electrode, said first electrode being coupled to the output, said second electrode being directly connected to a first power supply conductor to which is supplied a constant DC operating voltage, said first transistor being maintained conductive during operation of the voltage reference generator responsive to said DC operating voltage for providing the output reference voltage;

first diode means connected between said first power supply conductor and said control electrode of said first transistor; and current supply means coupled between said first electrode of said first transistor and a second power supply conductor.

2. The generator of claim 1 including:

a second transistor having first and second electrodes and a control electrode, said second electrode being coupled to said first electrode of said first transistor, said first electrode being coupled to said current supply means; and second diode means coupled between said control electrodes of said first and second transistors.

3. In a diode load emitter coupled logic circuit including first and second transistors each having an emitter, collector and base, said emitters interconnected to a current supply the latter of which supplies a predetermined current, diode load circuitry coupled to the respective collectors of the first and second transistors and the base of the first transistor coupled to an input at which are supplied logic input signals, the improvement comprising a voltage threshold generator circuit for providing a constant threshold voltage to the base of the second transistor including an additional transistor having an emitter coupled to the base of the second transistor, a collector directly connected to a first power supply conductor and a base; a diode directly connected between said first power supply conductor and said base of said additional transistor; and current supply means coupled between said emitter of said additional transistor and a second power supply conductor for sinking current the magnitude of which is determined by the current flowing through said diode is substantially equal to the magnitude of the current supplied by the current supply of the logic circuit.

4. The circuit of claim 3 wherein said voltage threshold generator includes another additional transistor having a collector coupled to said emitter of said additional transistor, an emitter coupled to said current supply means, and a base; and an additional diode coupled between said bases of said additional and another additional transistors.

* * * * *